US012684887B2

(12) United States Patent
Kimura

(10) Patent No.: US 12,684,887 B2
(45) Date of Patent: Jul. 14, 2026

(54) PHOTODETECTION DEVICE AND METHOD FOR MANUFACTURING PHOTODETECTION DEVICE

(71) Applicant: Sumitomo Electric Industries, Ltd., Osaka (JP)

(72) Inventor: Ren Kimura, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 726 days.

(21) Appl. No.: 17/859,374

(22) Filed: Jul. 7, 2022

(65) Prior Publication Data

US 2023/0044737 A1    Feb. 9, 2023

(30) Foreign Application Priority Data

Aug. 3, 2021    (JP) ................................. 2021-127769

(51) Int. Cl.
*H10F 39/00*    (2025.01)
*H10W 72/00*    (2026.01)
(Continued)

(52) U.S. Cl.
CPC ......... *H10F 39/809* (2025.01); *H10F 39/018* (2025.01); *H10W 72/01212* (2026.01);
(Continued)

(58) Field of Classification Search
CPC ........... H01L 24/81; H01L 2224/81801; H01L 2224/13109; H01L 2224/16; H01L 24/11;
(Continued)

(56) References Cited

U.S. PATENT DOCUMENTS 5,341,980 A  *  8/1994  Nishikawa ........... B23K 1/0016
                                                          228/205
2006/0281219 A1*  12/2006  Trezza ................ H10W 20/023
                                                          257/E21.597
(Continued)

FOREIGN PATENT DOCUMENTS

CN          104979478 A  * 10/2015
JP          S64-061029 A    3/1989
(Continued)

OTHER PUBLICATIONS

CN104979478A (Year: 2015).*
CN104979478A Translation (Year: 2015).*

*Primary Examiner* — Jessica S Manno
*Assistant Examiner* — Victor Joseph Lasasso
(74) *Attorney, Agent, or Firm* — Volpe Koenig

(57) ABSTRACT
A method of manufacturing a photodetection device, the method includes preparing a light-receiving element including a first main surface including an arrangement of a plurality of first electrodes, forming a first bump containing In on each of the plurality of first electrodes, preparing a circuit substrate including a second main surface including an arrangement of a plurality of second electrodes, forming a second bump containing In on each of the plurality of second electrodes, forming, at at least one of a surface of the first bump or a surface of the second bump, a first oxide film containing In, placing the first main surface and the second main surface so as to face each other, and placing the first bump and the second bump on top of each other with the first oxide film therebetween.

13 Claims, 22 Drawing Sheets

(51) Int. Cl.
    *H10W 72/20*       (2026.01)
    *H10W 90/00*       (2026.01)

(52) U.S. Cl.
    CPC .... *H10W 72/07236* (2026.01); *H10W 72/252*
        (2026.01); *H10W 72/255* (2026.01); *H10W*
            *90/722* (2026.01)

(58) Field of Classification Search
    CPC ........... H10D 30/6755; H10D 86/423; H10W
        72/07236; H10W 72/252; H10W 72/072;
           H10W 72/20; H10W 72/241; H10W
        72/251; H10W 72/073; H10W 72/07251;
           H10W 72/9415; H10W 74/15; H10P
                72/74
    See application file for complete search history.

(56)              References Cited

U.S. PATENT DOCUMENTS

| 2010/0320258 | A1 | 12/2010 | Sawada et al. |
| 2011/0127524 | A1* | 6/2011 | Yamazaki ............ H10D 86/423 |
| | | | 257/43 |
| 2012/0285923 | A1 | 11/2012 | Hampp et al. |
| 2013/0153645 | A1* | 6/2013 | Owens .................. H10F 39/809 |
| | | | 228/180.22 |

FOREIGN PATENT DOCUMENTS

| JP | 2011-003765 A | 1/2011 |
| JP | 2012-156374 A | 8/2012 |
| JP | 2015-012228 A | 1/2015 |

\* cited by examiner

PHOTODETECTION DEVICE AND METHOD FOR MANUFACTURING PHOTODETECTION DEVICE

CROSS REFERENCE TO RELATED APPLICATIONS

This application claims priority based on Japanese Patent Application No. 2021-127769 filed on Aug. 3, 2021, and the entire contents of the Japanese patent application are incorporated herein by reference.

TECHNICAL FIELD

The present disclosure relates to a photodetection device and a method for manufacturing a photodetection device.

BACKGROUND ART

As a photodetection device for detecting infrared rays, Japanese Unexamined Patent Application Publication No. 2015-12228 discloses a photodetection device in which a light-receiving element and a signal processing substrate are connected by an indium bump (In bump).

SUMMARY OF THE INVENTION

A method of manufacturing a photodetection device according to the present disclosure includes preparing a light-receiving element including a first main surface including an arrangement of a plurality of first electrodes, forming a first bump containing indium on each of the plurality of first electrodes, preparing a circuit substrate including a second main surface including an arrangement of a plurality of second electrodes, forming a second bump containing indium on each of the plurality of second electrodes, forming a first oxide film containing indium on at least one of a surface of the first bump or a surface of the second bump, aligning the first bump and the second bump on top of each other with the first oxide film therebetween by placing the first main surface and the second main surface so as to face each other, and bonding together the first bump and the second bump to form a conductive connection portion under reduction of the first oxide film by heat treating in a reducing atmosphere.

BRIEF DESCRIPTION OF THE DRAWINGS

FIG. 21 is a cross-sectional view (Part 1) illustrating a method of bonding a light-receiving element and a readout circuit substrate in a first embodiment.

FIG. 22 is a cross-sectional view (Part 2) illustrating a method of bonding a light-receiving element and a readout circuit substrate in a first embodiment.

FIG. 25 is a cross-sectional view (Part 2) illustrating a method of bonding a light-receiving element and a readout circuit substrate in a second embodiment.

3

DETAILED DESCRIPTION OF THE INVENTION

Figure 1:
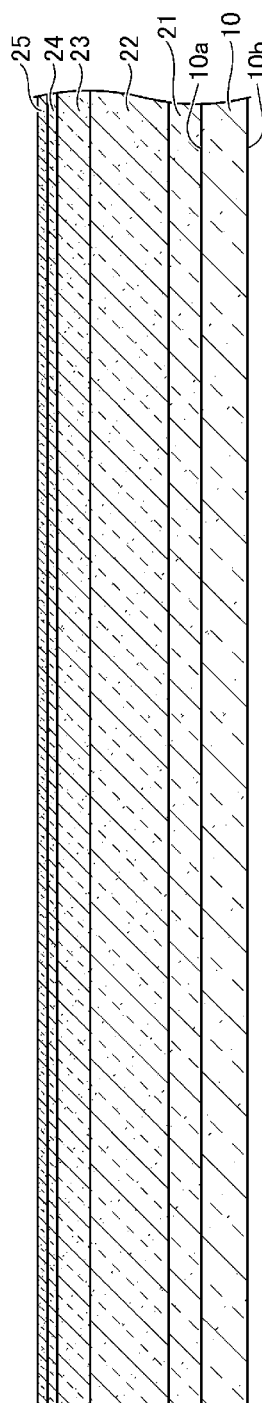
FIG. 1 is a cross-sectional view (Part 1) illustrating a method of preparing a light-receiving element in a first embodiment.

In the conventional manufacturing method, the In bump may be deformed during the manufacturing of the photodetection device. The deformation of In bump may lead to a short circuit between pixels.

DESCRIPTION OF EMBODIMENTS OF THE PRESENT DISCLOSURE

Embodiments of the present disclosure are first listed and described. In the following description, the same or corresponding elements are denoted by the same reference numerals, and the same description thereof will not be repeated.

[1] A method of manufacturing a photodetection device according to an aspect of the present disclosure includes preparing a light-receiving element including a first main surface including an arrangement of a plurality of first electrodes, forming a first bump containing indium (In) on each of the plurality of first electrodes, preparing a circuit substrate including a second main surface including an arrangement of a plurality of second electrodes, forming a second bump containing In on each of the plurality of second electrodes, forming a first oxide film containing In on at least one of a surface of the first bump or a surface of the second bump, aligning the first bump and the second bump on top of each other with the first oxide film therebetween by placing the first main surface and the second main surface so as to face each other, and bonding together the first bump and the second bump to form a conductive connection portion under reduction of the first oxide film by heat treating in a reducing atmosphere.

A first oxide film containing In is formed on at least one of the surface of the first bump or the surface of the second bump, and bonding together the first bump and the second bump to form a conductive connection portion under reduction of the first oxide film by heat treating in a reducing atmosphere. Since the first oxide film is harder than the first bump and the second bump, deformation of at least one of the first bump or the second bump can be suppressed as compared with a case where the first oxide film is not formed.

[2] As for [1], the first oxide film may be formed at least at the surface of the first bump. In this case, deformation of the first bump formed on the light-receiving element can be suppressed.

[3] As for [1], the first oxide film may be formed at both of the surface of the first bump and the surface of the second bump. In this case, deformation of both the first bump formed on the light-receiving element and the second bump formed on the circuit substrate can be suppressed.

[4] As for any one of [1] to [3], the first oxide film may have a thickness of 1 nm or more. The thicker the first oxide film is, the easier it is to suppress deformation of the bump on which the first oxide film is formed.

[5] As for any one of [1] to [4], the first oxide film may be formed by sputtering, vacuum evaporation, thermal oxidation, natural oxidation, or wet treatment. The first oxide film can be formed by various methods.

[6] As for any one of [1] to [5], the reducing atmosphere may include formic acid. In this case, the atmosphere can be easily controlled.

[7] As for any one of [1] to [6], the method may further include forming, at a surface of the conductive connection portion, a second oxide film containing In. In this case, deformation of the conductive connection portion can be suppressed. For example, the deformation of the conductive connection portion can be suppressed not only when an external force in a compression direction acts on the conductive connection portion but also when an external force in a shear direction acts thereon.

[8] As for [7], the second oxide film has a thickness of 1 nm or more. The thicker the second oxide film is, the more easily deformation of the conductive connection portion is suppressed.

[9] A photodetection device according to another aspect of the present disclosure includes a light-receiving element including a first main surface including an arrangement of a plurality of first electrodes, a circuit substrate including a second main surface facing the first main surface and including an arrangement of a plurality of second electrodes, a plurality of conductive connection portions containing In and connecting each of the first electrodes to a corresponding one of the second electrodes, and a plurality of oxide films formed individually at surfaces of the plurality of conductive connection portions and containing In.

Since the oxide film containing In is formed on each surface of the conductive connection portion, the deformation of the conductive connection portion can be suppressed. For example, the deformation of the conductive connection portion can be suppressed not only when an external force in a compression direction acts on the conductive connection portion but also when an external force in a shear direction acts thereon.

DETAILS OF EMBODIMENT OF THE PRESENT DISCLOSURE

Hereinafter, one embodiment of the present disclosure will be described in detail, but the present embodiment is not limited thereto.

First Embodiment

First, an outline of the first embodiment will be described. In the first embodiment, a light-receiving element including a first main surface on which a plurality of first electrodes are arranged and a circuit substrate including a second main surface on which a plurality of second electrodes are arranged are prepared. A first bump containing In is formed on each of the plurality of first electrodes, and an oxide film containing In is formed on the surface of the first bump. Further, a second bump containing In is formed on each of the plurality of second electrodes, and an oxide film containing In is formed on at least one surface of the second bump. Next, the first main surface of the light-receiving element and the second main surface of the circuit substrate are placed so as to face each other, and the first bump and the second bump are aligned on top of each other with the oxide film therebetween. Next, the conductive connection portion is formed by heat treating in a reducing atmosphere to, under reduction of the oxide film, bond together the first bump and the second bump to form a conductive connection portion.

A method of preparing a light-receiving element 100 will now be described. FIGS. 1 to 7 are cross-sectional views illustrating a method of preparing a light-receiving element in a first embodiment.

First, as shown in FIG. 1, an n-type contact layer 21, a light-receiving layer 22, a n-type wide gap layer 23, a p-type wide gap layer 24, and a p-type contact layer 25 are sequentially formed on one main surface 10a of a substrate 10 by epitaxial growth. A metal organic vapor phase epitaxial growth (MOVPE) method is used for the epitaxial growth of the compound semiconductor.

Substrate 10 has a thickness of about 350 μm. Substrate 10 is an InP (indium phosphide) substrate doped with Fe (iron) as an impurity element and semi-insulated. N-type contact layer 21 is formed of n-InP having a film thickness of about 2 μm. N-type contact layer 21 is doped with Si (silicon) as an n-type impurity element at a concentration of about $2\times10^{18}$ cm$^{-3}$. Light-receiving layer 22 is made of In$_{0.53}$Ga$_{0.47}$As having a thickness of about 3.5 μm and not doped with an impurity element. The band gap of light-receiving layer 22 at room temperature is 0.75 eV. Since light-receiving layer 22 is not doped with an impurity element, the concentration of the contained impurity element is $1\times10^{15}$ cm$^{-3}$ or less.

N-type wide gap layer 23 is formed of n-InP having a film thickness of about 0.5 μm. N-type wide gap layer 23 is doped with Si as an n-type impurity element at a concentration of about $2\times10^{15}$ cm$^{-3}$. P-type wide gap layer 24 is formed of p-InP having a film thickness of about 0.2 μm. P-type wide gap layer 24 is doped with Zn (Zinc) as a p-type impurity element at a concentration of about $2\times10^{18}$ cm$^{-3}$. As a result, a pn junction is formed at the interface between n-type wide gap layer 23 and p-type wide gap layer 24. P-type contact layer 25 is formed of p-InGaAs having a film thickness of about 0.1 μm. P-type contact layer 25 is doped with Zn as a p-type impurity element at a concentration of about $1\times10^{19}$ cm$^{-3}$.

Figure 2:
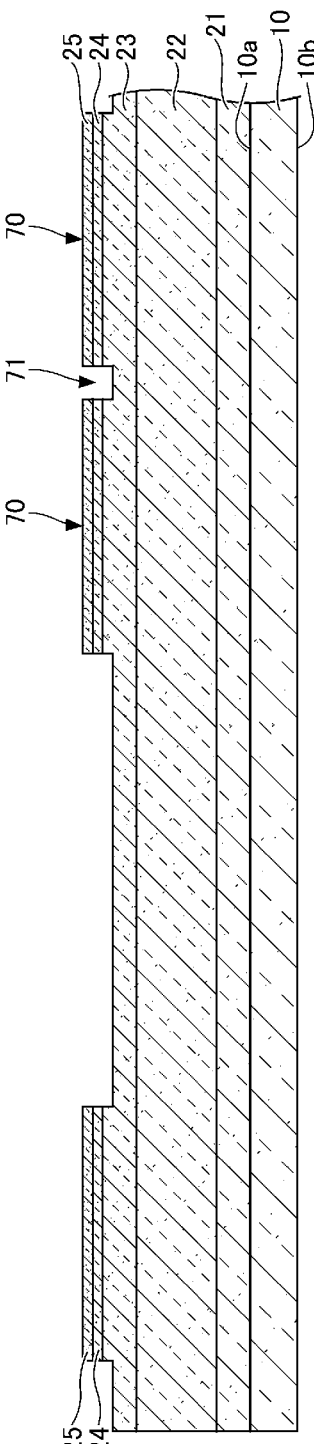
FIG. 2 is a cross-sectional view (Part 2) illustrating a method of preparing a light-receiving element in a first embodiment.

Next, as shown in FIG. 2, a first trench 71 for pixel separation is formed. To be more specific, an SiN film (not shown) having a 100 nm thickness is formed on p-type contact layer 25 by plasma chemical vapor deposition (PCVD). A photoresist is coated onto the formed SiN film. The photoresist is exposed and developed to form a resist pattern (not shown). The resist pattern has an opening portion in a region where first trench 71 is formed. The SiN film in the opening portion of the resist pattern is removed by wet etching using buffered hydrofluoric acid to form a mask of the SiN film. Thereafter, the resist pattern (not shown) is removed by an organic solvent or the like. Thereafter, portions of p-type contact layer 25, p-type wide gap layer 24, and n-type wide gap layer 23 in the region from which the SiN film has been removed are removed by dry etching such as reactive ion etching (RIE). In this manner, first trench 71 for pixel separation is formed. In this step, the semiconductor layer in a region where a second trench 72 described later is formed is also removed in the same manner. Thereafter, the SiN film (not shown) is removed by buffered hydrofluoric acid.

The depth of first trench 71 is about 0.6 μm. The width of first trench 71 is about 5 μm. N-type wide gap layer 23 is exposed at the bottom surface of first trench 71. Each pixel is formed by mesas 70 separated by first trench 71. For example, 128 pixels are formed at a pitch of 90 μm in a vertical direction, and 32 pixels are formed at a pitch of 90 μm in a horizontal direction, for a total of 4096 pixels.

Figure 3:
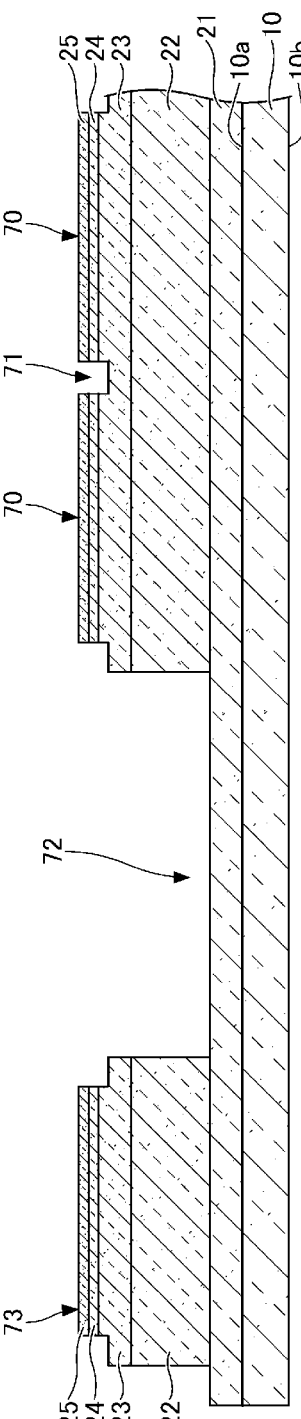
FIG. 3 is a cross-sectional view (Part 3) illustrating a method of preparing a light-receiving element in a first embodiment.

Next, as shown in FIG. 3, second trench 72 is formed along the outer periphery of substrate 10. To be specific, an SiN film (not shown) having a thickness of 100 nm is formed on p-type contact layer 25 and the like by a PCVD method. A photoresist is coated onto the formed SiN film. The photoresist is exposed and developed to form a resist pattern (not shown). The resist pattern has an opening portion in a region where second trench 72 is formed. The SiN film in the opening portion of the resist pattern is removed by wet etching using buffered hydrofluoric acid to form a mask of the SiN film. Thereafter, the resist pattern (not shown) is removed by an organic solvent or the like. Further, n-type wide gap layer 23 and light-receiving layer 22 in the region where the SiN film has been removed are removed by dry etching such as RIE. In this manner, the surface of n-type contact layer 21 is exposed. Thereafter, the SiN film (not shown) is removed by buffered hydrofluoric acid. In this manner, a mesa 73 is formed outside second trench 72.

Figure 4:
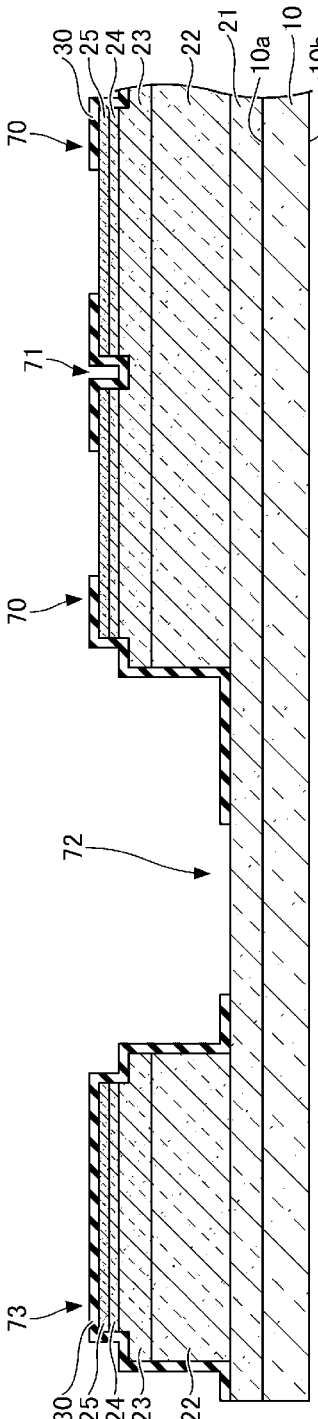
FIG. 4 is a cross-sectional view (Part 4) illustrating a method of preparing a light-receiving element in a first embodiment.

Next, as shown in FIG. 4, a passivation film 30 is formed. To be specific, an SiN film (not shown) having a 100 nm thickness is formed on the entire surface by a PCVD method. A photoresist is coated onto the formed SiN film. The photoresist is exposed and developed to form a resist pattern (not shown). The resist pattern has an opening portion in a region where an n-electrode 140 and a p-electrode 150 are formed. The SiN film in the opening portion of the resist pattern is removed by dry etching such as RIE. In this manner, the surfaces of p-type contact layer 25 and n-type contact layer 21 on the upper surface of a mesa 70 are exposed.

Figure 5:
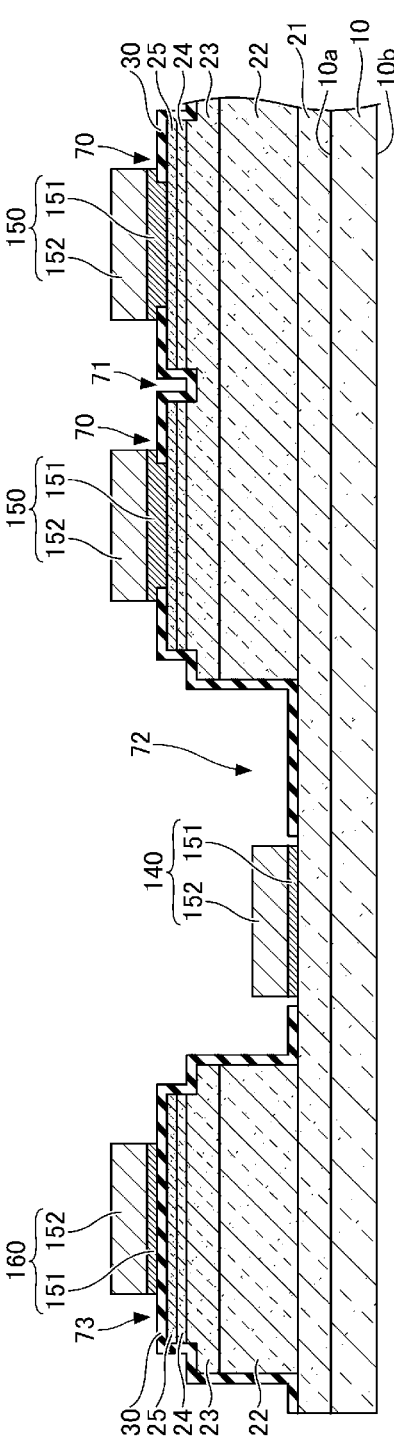
FIG. 5 is a cross-sectional view (Part 5) illustrating a method of preparing a light-receiving element in a first embodiment.

Next, as shown in FIG. 5, n-electrode 140 is formed on n-type contact layer 21. P-electrode 150 is formed on p-type contact layer 25. A wiring electrode 160 is formed on mesa 73 of an outer periphery via passivation film 30. N-electrode 140, p-electrode 150, and wiring electrode 160 are formed by a lift-off method. Specifically, a resist pattern (not shown) having an opening portion in a region where each electrode is formed is formed. Next, a metal laminated film in which a Ti layer 151 and a Pt layer 152 are laminated in order is formed by electron beam (EB) evaporation. Thereafter, the metal laminated film on the resist pattern is removed together with the resist pattern by being immersed in an organic solvent or the like. N-electrode 140, p-electrode 150, and wiring electrode 160 are configured by the remaining metal laminated film. P-electrode 150 and wiring electrode 160 are examples of a first electrode.

Figure 6:
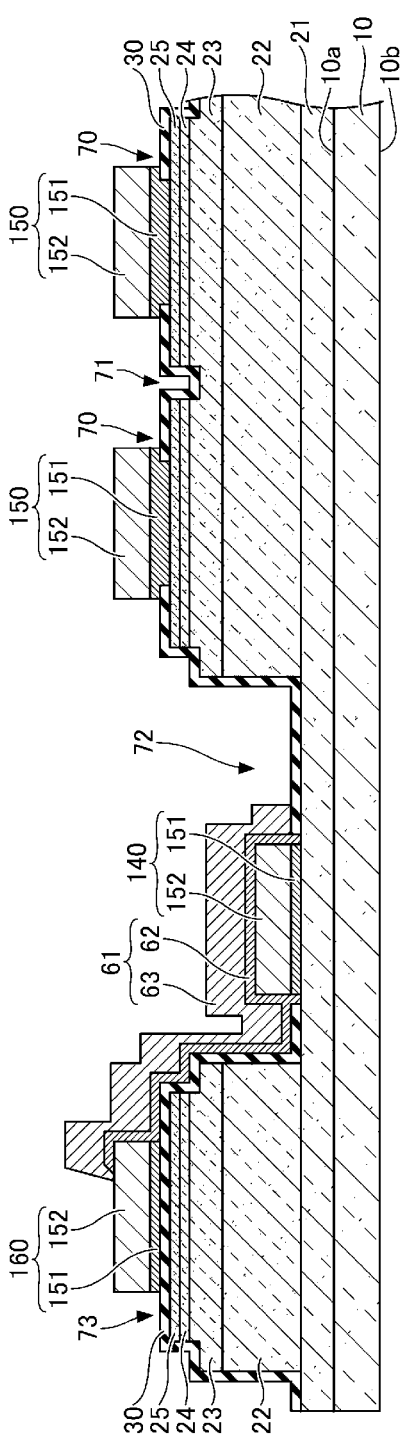
FIG. 6 is a cross-sectional view (Part 6) illustrating a method of preparing a light-receiving element in a first embodiment.

Next, as shown in FIG. 6, a wiring 61 for connecting n-electrode 140 and wiring electrode 160 is formed by a lift-off method. Wiring 61 is configured by a laminated film of a Ti layer 62 having a thickness of about 50 nm and an Au layer 63 having a thickness of about 600 nm. Thereafter, a main surface 10b opposite to main surface 10a of substrate 10 is mirror-finished by polishing.

Figure 7:
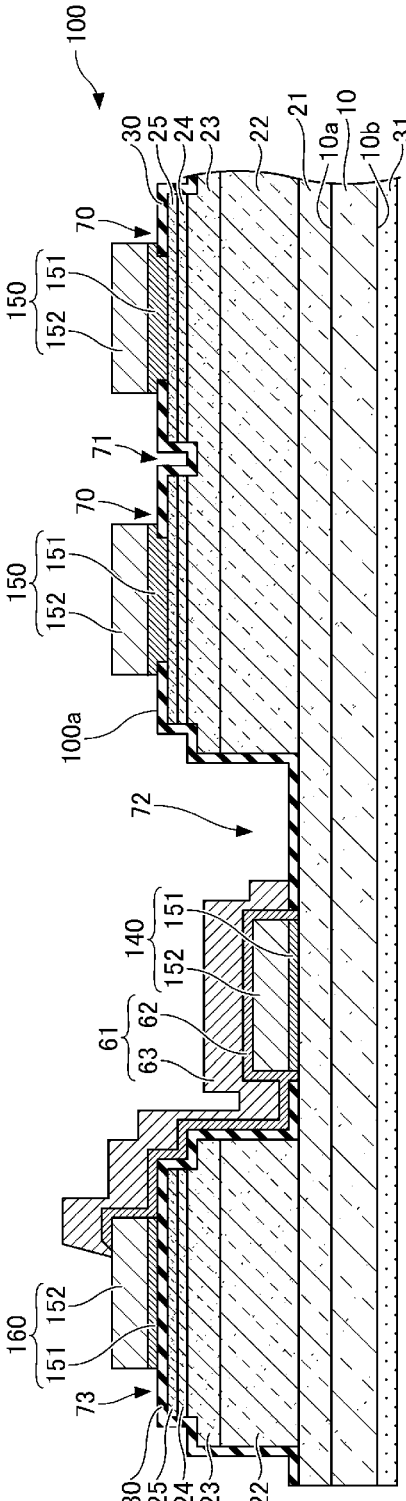
FIG. 7 is a cross-sectional view (Part 7) illustrating a method of preparing a light-receiving element in a first embodiment.

Next, as shown in FIG. 7, an antireflection film 31 made of SiN film is formed on main surface 10b of substrate 10. Antireflection film 31 is formed by forming an SiN film by a PCVD method. The refractive index of antireflection film 31 is about from 1.71 to 1.83. The thickness of antireflection film 31 is from 140 nm to 160 nm.

In this way, light-receiving element 100 is provided. Light-receiving element 100 has a first main surface 100a on a side of substrate 10 on which p-electrode 150 and wiring electrode 160 are provided. A plurality of p-electrodes 150 and wiring electrodes 160 are arranged on first main surface 100a.

Next, a method of forming a first bump containing In and a method of forming an oxide film containing In on the surface of the first bump will be described. FIGS. 8 to 13 are cross-sectional views illustrating a method of forming a first bump and an oxide film in the first embodiment.

Figure 8:
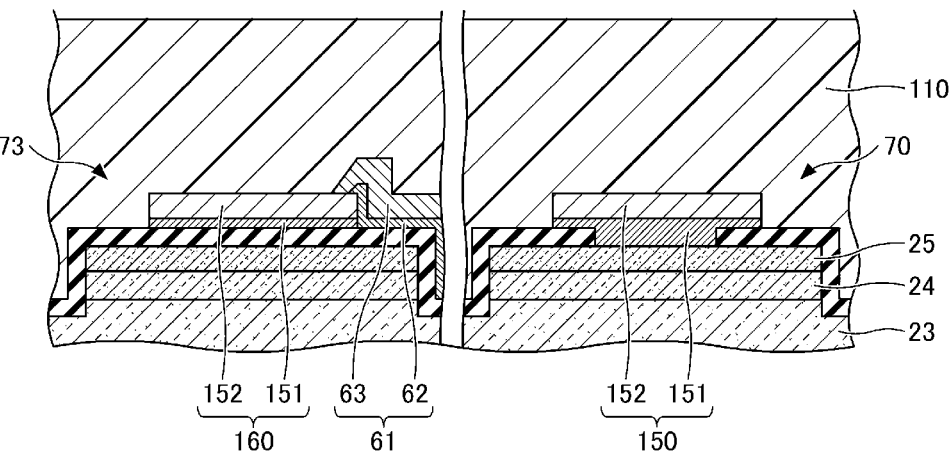
FIG. 8 is a cross-sectional view (Part 1) illustrating a method of forming a first bump and an oxide film in a first embodiment.

As shown in FIG. 8, a photoresist film 110 is formed. Photoresist film 110 is formed on passivation film 30, p-electrode 150, wiring electrode 160, and wiring 61 by coating.

Figure 9:
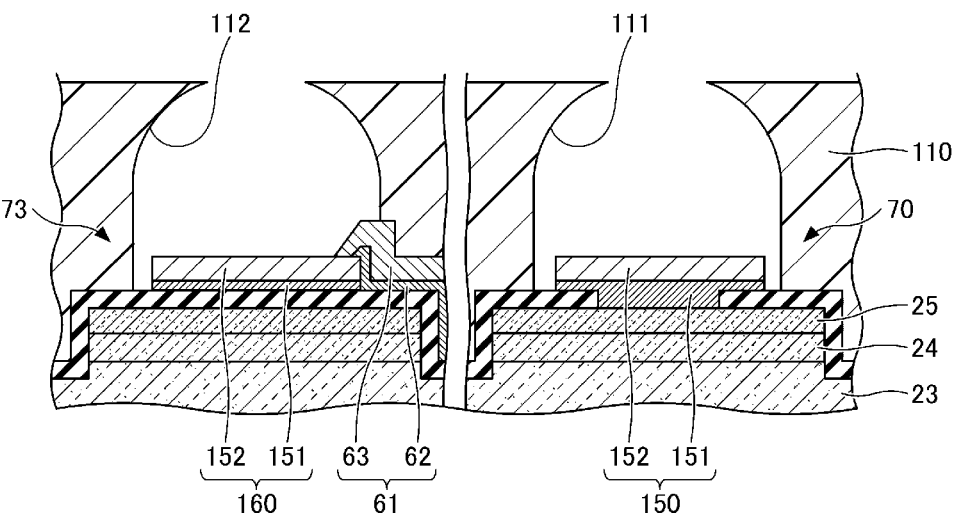
FIG. 9 is a cross-sectional view (Part 2) illustrating a method of forming a first bump and an oxide film in a first embodiment.

Next, as shown in FIG. 9, an opening portion 111 and an opening portion 112 are formed. Photoresist film 110 is exposed and developed to form opening portion 111 exposing p-electrode 150 and opening portion 112 exposing wiring electrode 160 in photoresist film 110.

Figure 10:
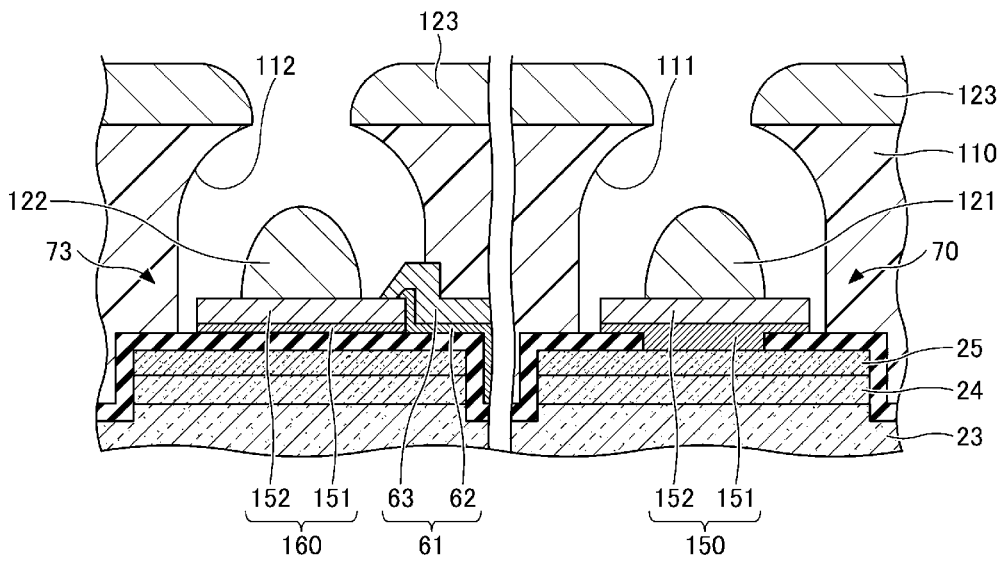
FIG. 10 is a cross-sectional view (Part 3) illustrating a method of forming a first bump and an oxide film in a first embodiment.

Next, as shown in FIG. 10, an EB evaporation of In is performed. As a result, an In film 121 is formed on p-electrode 150 inside opening portion 111. An In film 122 is formed on wiring electrode 160 inside opening portion 112. An In film 123 is formed on photoresist film 110. The thickness of In film 121 and In film 122 is, for example, from 2 μm to 15 μm.

Figure 11:
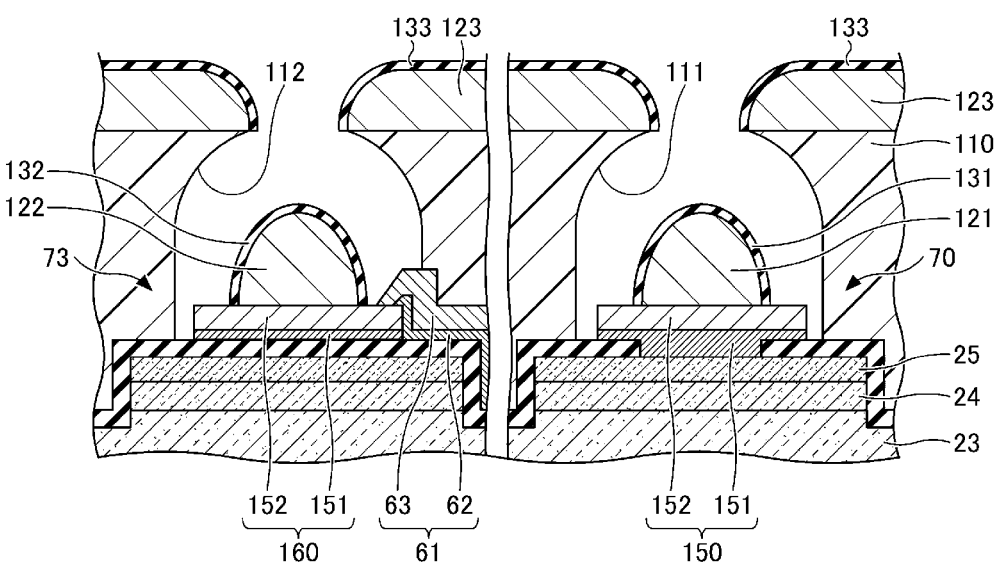
FIG. 11 is a cross-sectional view (Part 4) illustrating a method of forming a first bump and an oxide film in a first embodiment.

Next, as shown in FIG. 11, a sputtering of an oxide containing In, for example, $In_2O_3$ (indium oxide), is performed. As a result, an oxide film 131 containing In is formed on the surface of In film 121. An oxide film 132 containing In is formed on the surface of In film 122. An oxide film 133 containing In is formed on the surface of In film 123. Oxide film 131, oxide film 132, and oxide film 133 are, for example, $In_2O_3$ films.

When oxide film 131, oxide film 132, and oxide film 133 are formed by a sputtering such as a reactive sputtering, for example, a structure illustrated in FIG. 10 is placed in a film forming chamber. An internal pressure of the film forming chamber is $3\times10^{-6}$ Torr. An $In_2O_3$ sintered material is used as a target material. A mixture gas of Ar (argon) gas and $O_2$ gas is supplied into the film forming chamber. A partial pressure of the $O_2$ gas is $1\times10^{-4}$ Torr. A total pressure of the mixture gas is $5\times10^{-3}$ Torr. A target voltage is 2 kV. A power density is from 3.2 $W/cm^2$ to 4.8 $W/cm^2$. A film forming speed is set to 0.13 nm/see to 0.23 nm/sec.

A method of forming oxide film 131 and oxide film 132 is not limited to a sputtering. Oxide films 131 and 132 may be formed by a vacuum evaporation, a thermal oxidation, a natural oxidation, or an wet treatment. As described above, oxide film 131 and oxide film 132 may be formed by various methods.

When oxide film 131 and oxide film 132 are formed by a vacuum evaporation, for example, a structure shown in FIG. 10 is placed in the film forming chamber. An internal pressure of the film forming chamber is $2\times10^{-5}$ Torr. $In_2O_3$ powder is used as an evaporation source, and a temperature of substrate 10 is set to 100° C. A film forming speed is set to 0.2 nm/sec to 0.3 nm/sec.

Figure 12:
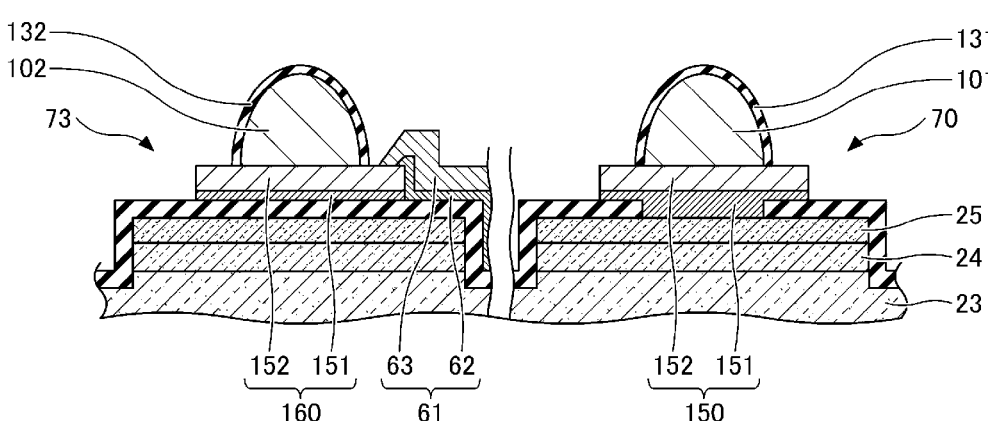
FIG. 12 is a cross-sectional view (Part 5) illustrating a method of forming a first bump and an oxide film in a first embodiment.
Figure 13:
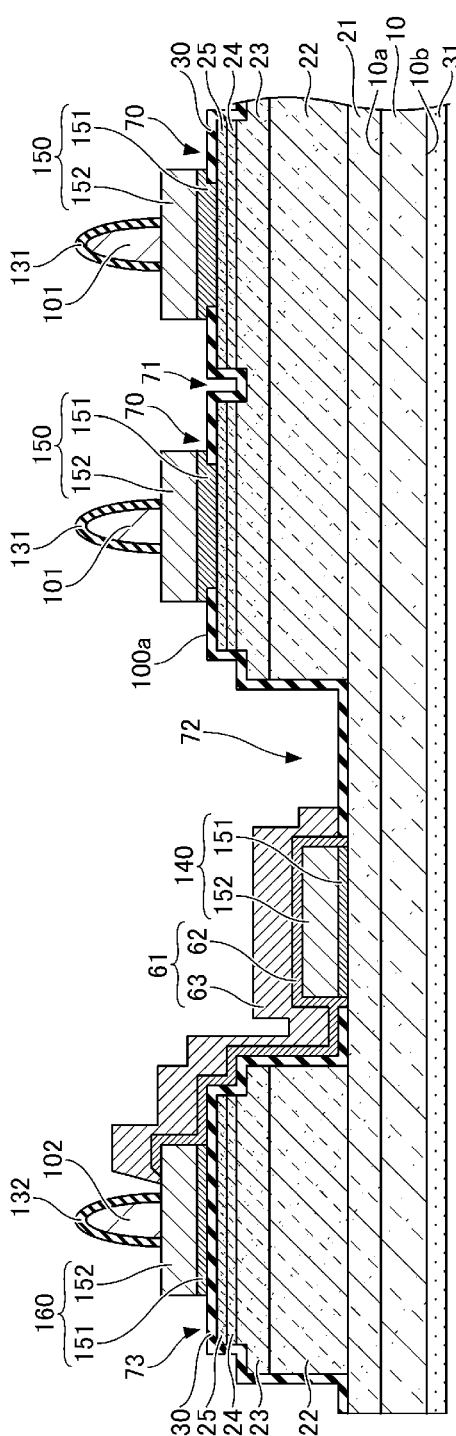
FIG. 13 is a cross-sectional view (Part 6) illustrating a method of forming a first bump and an oxide film in a first embodiment.

Next, as shown in FIG. 12, photoresist film 110 is removed. As photoresist film 110 is removed, In film 123 and oxide film 133 are also removed. As shown in FIGS. 12 and 13, a remaining In film 121 forms an In bump 101. A remaining In film 122 forms an In bump 102. In this manner, In bump 101 and In bump 102 are formed by a lift-off method. A surface of In bump 101 is covered with oxide film 131. A surface of In bump 102 is covered with oxide film 132. In bump 101 and In bump 102 are examples of first bumps. Each of oxide film 131 and oxide film 132 is an example of a first oxide films.

Photoresist film 110 can be removed by dissolution using, for example, an organic solvent such as acetone or a so-called resist remover solution such as N-methylpyrrolidone (NMP). For example, photoresist film 110 can be removed by immersing the structure shown in FIG. 11 in acetone or NMP at a temperature of 60° C. or less and holding it for about 24 hours. When oxide film 131 and oxide film 132 are formed, photoresist film 110 may be kept in a high temperature environment and may be solidified or carbonized. In this case, photoresist film 110 may be removed by $O_2$ ashing, for example.

In this manner, In bump 101 and In bump 102 are formed as first bumps containing In. Oxide film 131 is formed as an oxide film containing In on the surface of In bump 101. Oxide film 132 is formed as an oxide film containing In on the surface of In bump 102.

Next, a method of forming a second bump containing In and a method of forming an oxide film containing In on the surface of the second bump will be described. FIGS. 14 to 20 are cross-sectional views illustrating a method of forming a second bump and an oxide film according to the first embodiment.

Figure 14:
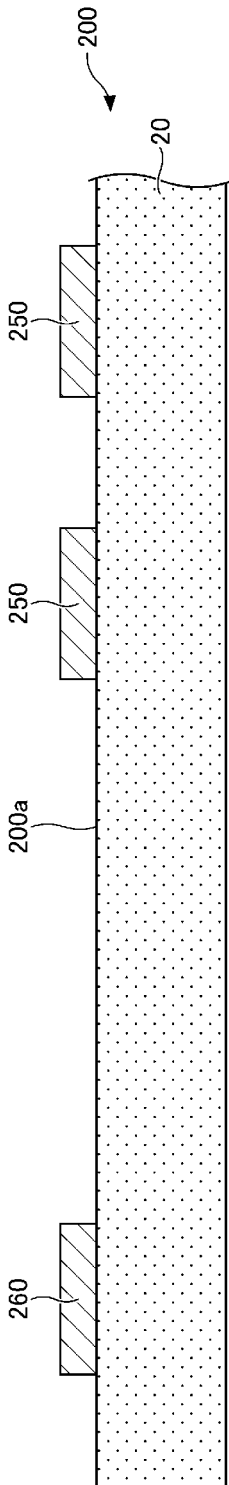
FIG. 14 is a cross-sectional view (Part 1) illustrating a method of forming a second bump and an oxide film in a first embodiment.

First, as shown in FIG. 14, a readout circuit substrate (ROIC) 200 is prepared. Readout circuit substrate 200 includes a wiring substrate 20, a plurality of pixel electrodes 250, and a common electrode 260. The plurality of pixel electrodes 250 and common electrode 260 are arranged on one surface of wiring substrate 20. Pixel electrode 250 is connected to p-electrode 150, and common electrode 260 is connected to wiring electrode 160. Readout circuit substrate 200 is an example of a circuit substrate. Readout circuit substrate 200 has a second main surface 200a on a side of wiring substrate 20 on which pixel electrode 250 and common electrode 260 are provide. Pixel electrode 250 and common electrode 260 are arranged on second main surface 200a.

Figure 15:
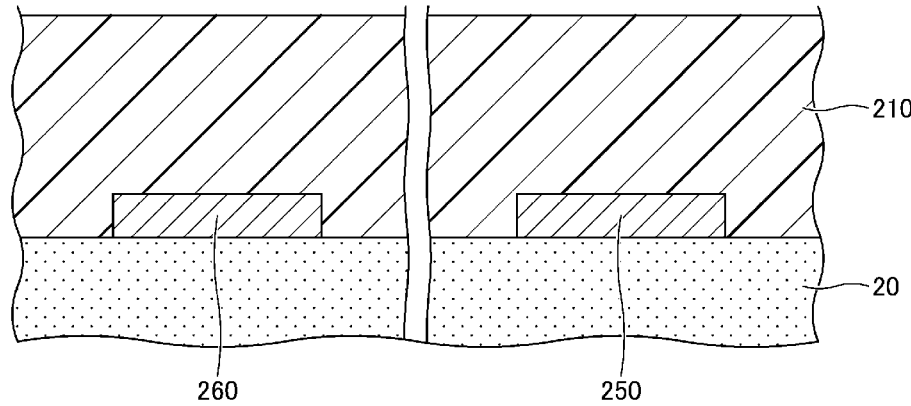
FIG. 15 is a cross-sectional view (Part 2) illustrating a method of forming a second bump and an oxide film in a first embodiment.

Next, as shown in FIG. 15, a photoresist film 210 is formed. Photoresist film 210 is formed on wiring substrate 20, pixel electrode 250, and common electrode 260 by coating.

Figure 16:
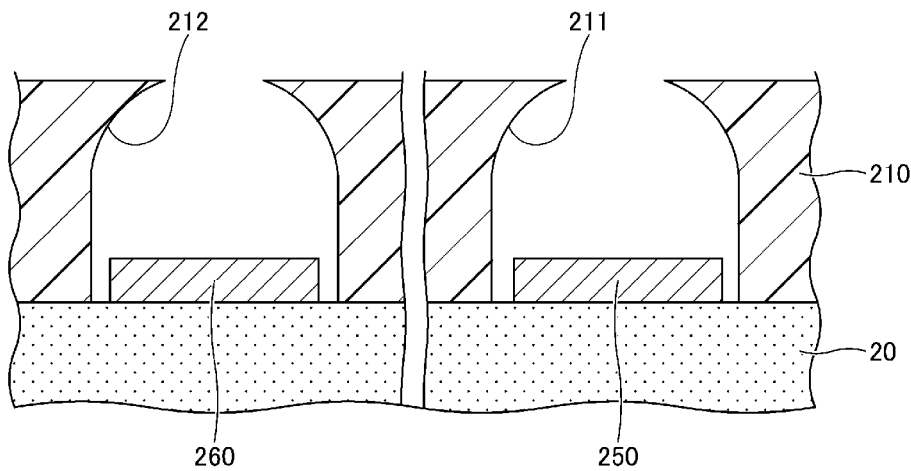
FIG. 16 is a cross-sectional view (Part 3) illustrating a method of forming a second bump and an oxide film in a first embodiment.

Next, as shown in FIG. 16, an opening portion 211 and an opening portion 212 are formed. Opening portion 211 exposing pixel electrode 250 and opening portion 212 exposing common electrode 260 are formed on photoresist film 210 by exposing and developing photoresist film 210.

Figure 17:
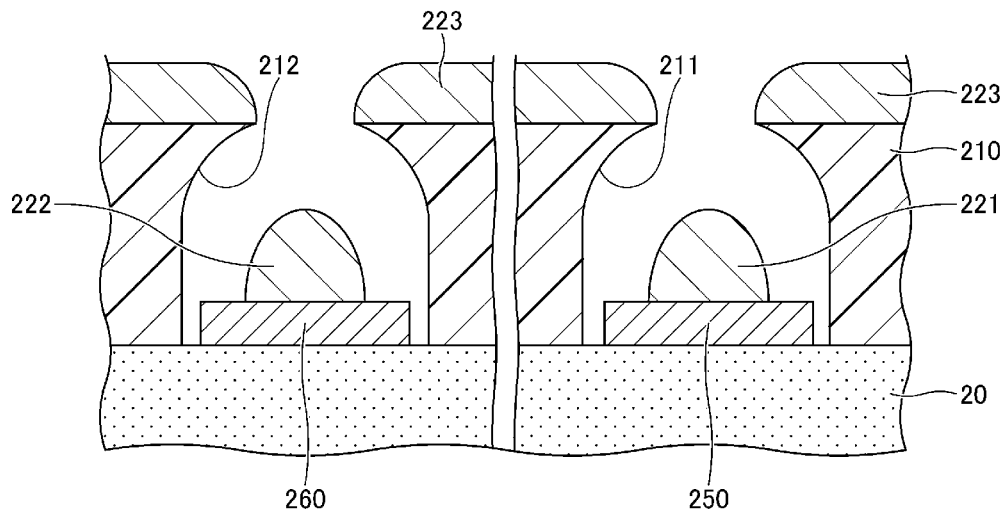
FIG. 17 is a cross-sectional view (Part 4) illustrating a method of forming a second bump and an oxide film in the first embodiment.

Next, as shown in FIG. 17, an EB evaporation of In is performed. As a result, an In film 221 is formed on pixel electrode 250 inside opening portion 211. An In film 222 is formed on common electrode 260 inside opening portion 212. An In film 223 is formed on photoresist film 210.

Figure 18:
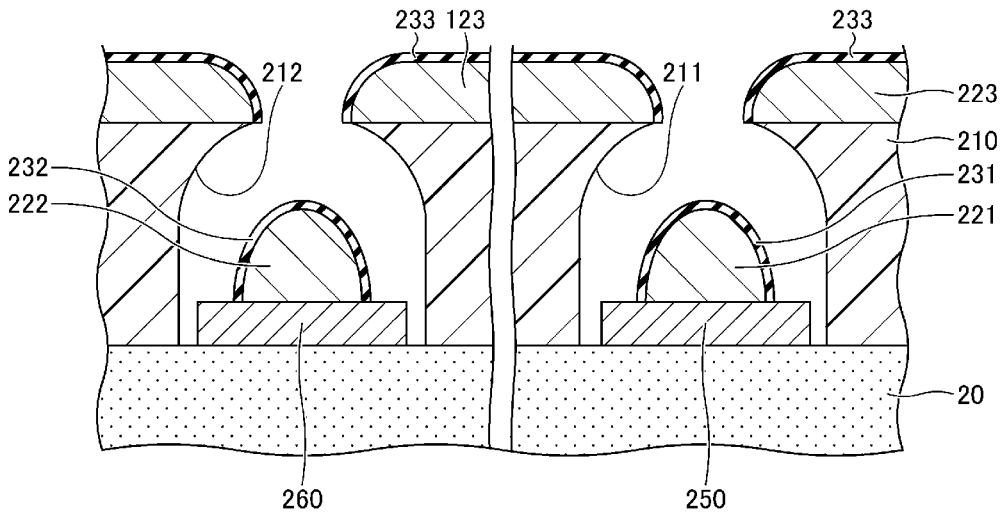
FIG. 18 is a cross-sectional view (Part 5) illustrating a method of forming a second bump and an oxide film in a first embodiment.

Next, as shown in FIG. 18, a sputtering of an oxide containing In, for example, $In_2O_3$, is performed. As a result, an oxide film 231 containing In is formed on the surface of In film 221. An oxide film 232 containing In is formed on the surface of In film 222. An oxide film 233 containing In is formed on the surface of In film 223. Oxide film 231, oxide film 232, and oxide film 233 are, for example, $In_2O_3$ films. Oxide film 231 and oxide film 232 can be formed under conditions similar to those of oxide film 131 and oxide film 132.

Figure 19:
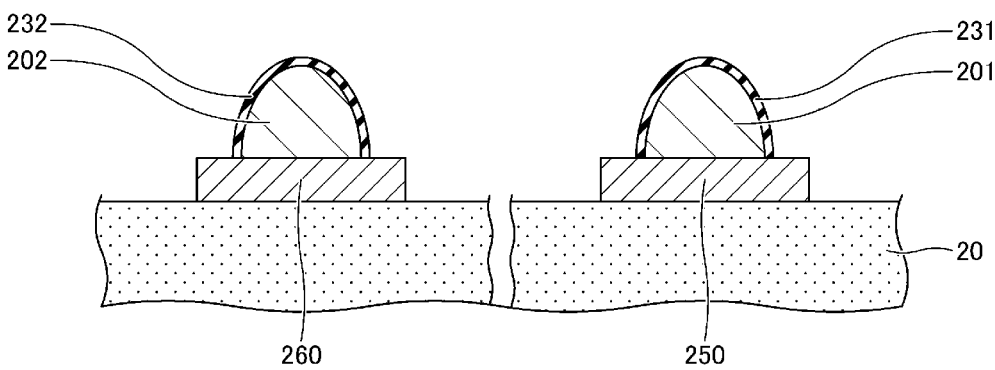
FIG. 19 is a cross-sectional view (Part 6) illustrating a method of forming a second bump and an oxide film in the first embodiment.
Figure 20:
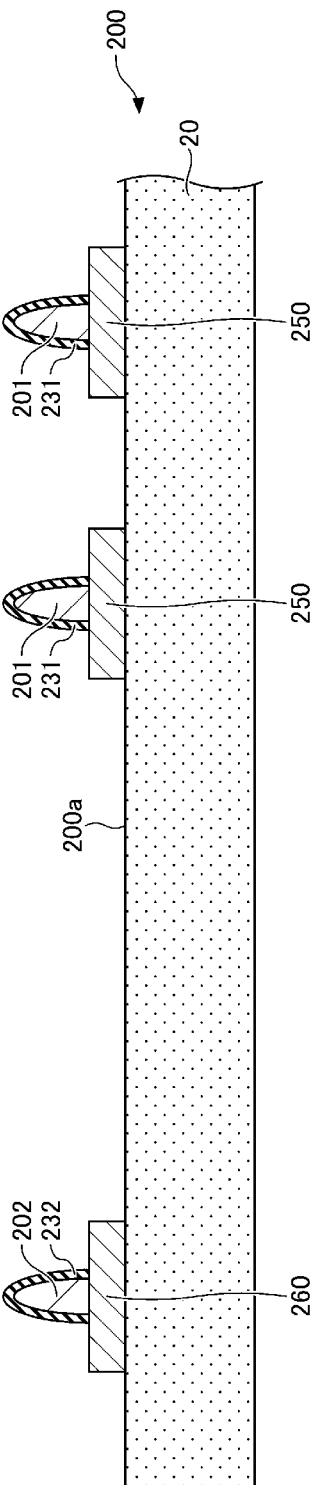
FIG. 20 is a cross-sectional view (Part 7) illustrating a method of forming a second bump and an oxide film in a first embodiment.

Next, as shown in FIG. 19, photoresist film 210 is removed. As photoresist film 210 is removed, In film 223 and oxide film 233 are also removed. Photoresist film 210 may be removed under the same conditions as photoresist film 110. As shown in FIGS. 19 and 20, a remaining In film 221 forms an In bump 201. A remaining In film 222 forms an In bump 202. In this manner, In bump 201 and In bump 202 are formed by a lift-off method. The surface of In bump 201 is covered with oxide film 231. The surface of In bump 202 is covered with oxide film 232. In bump 201 and In bump 202 are examples of second bumps. Oxide film 231 and oxide film 232 are examples of second oxide films.

Figure 21:
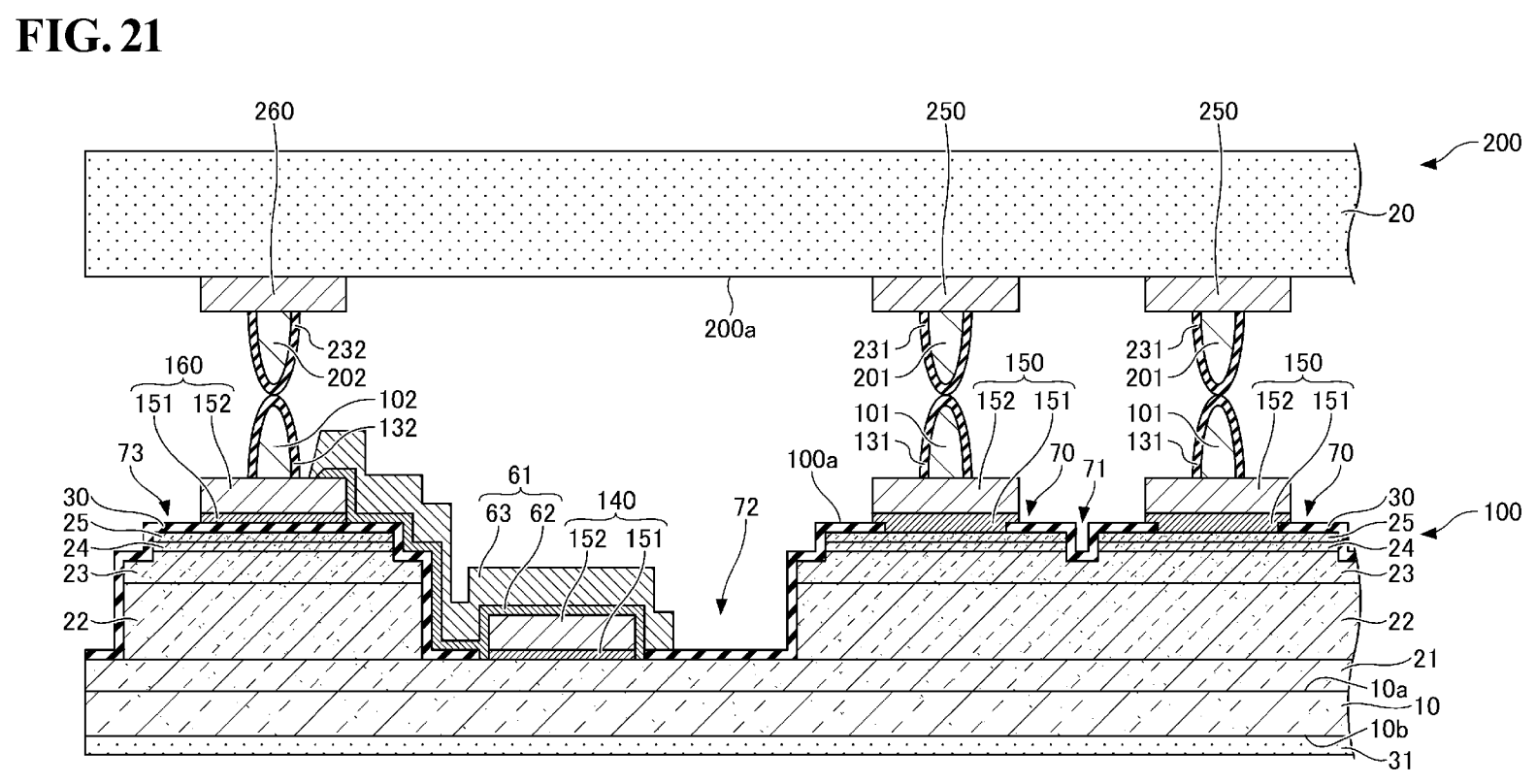
Figure 22:
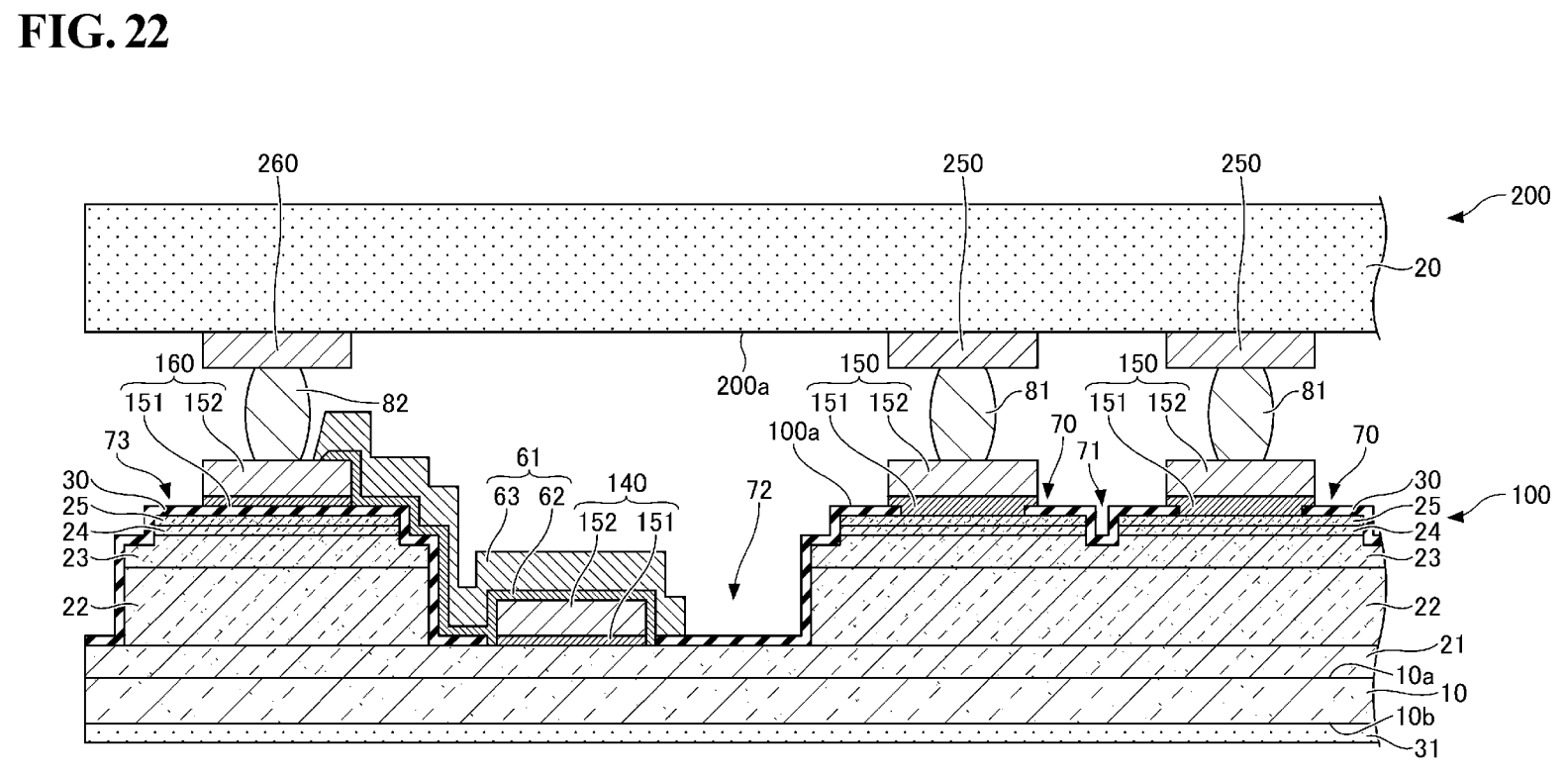
Figure 23:
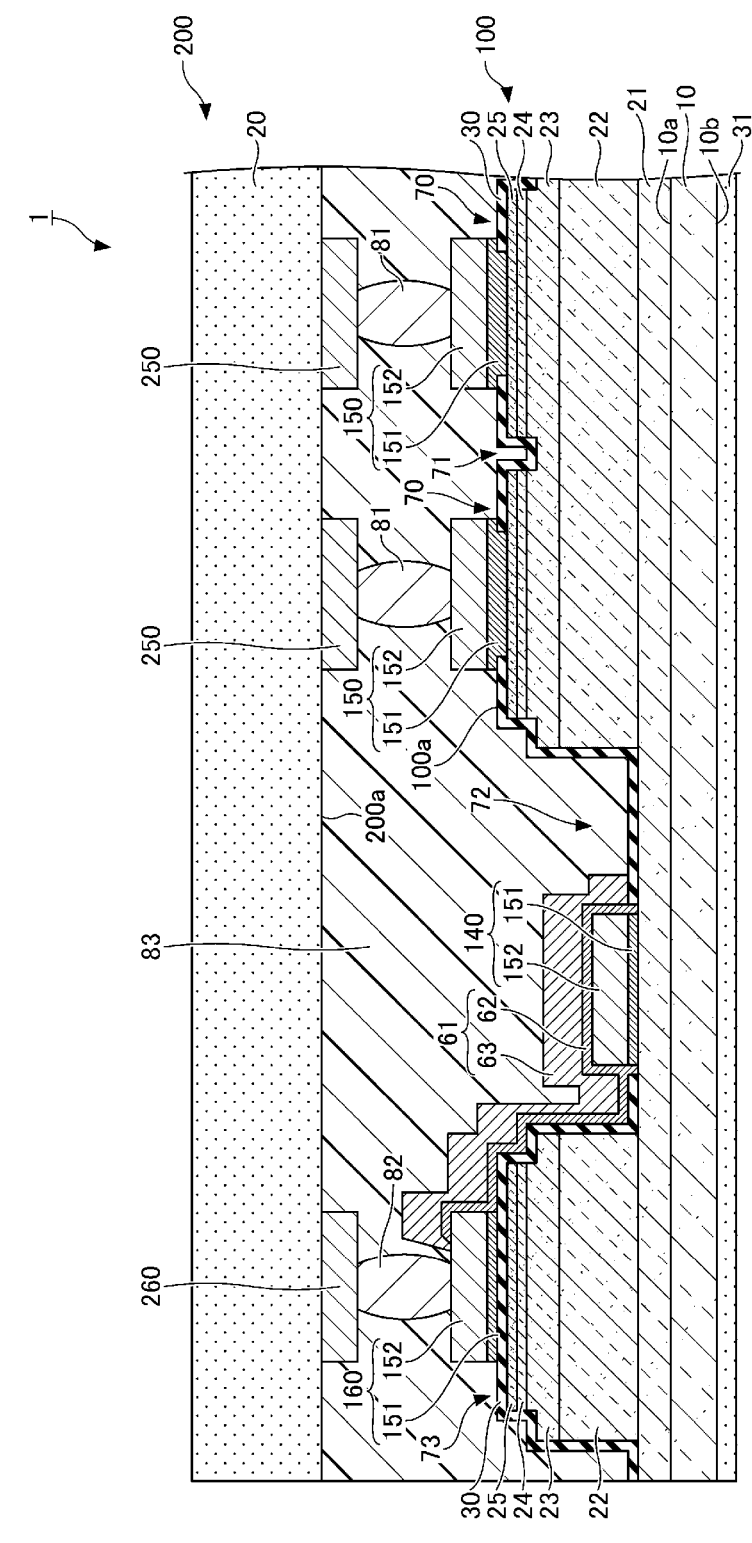
FIG. 23 is a cross-sectional view (Part 3) illustrating a method of bonding a light-receiving element and a readout circuit substrate in a first embodiment.

Next, a method of bonding light-receiving element 100 and readout circuit substrate 200 will be described. FIGS. 21 to 23 are cross-sectional views illustrating a method of bonding together a light-receiving element and a readout circuit substrate in the first embodiment.

First, as shown in FIG. 21, readout circuit substrate 200 is placed on light-receiving element 100. At this time, first main surface 100a of light-receiving element 100 and second main surface 200*a* of readout circuit substrate 200 face each other. In bump 101 and In bump 201 are aligned with oxide film 131 and oxide film 231 interposed therebetween. In bump 102 and In bump 202 are aligned with oxide film 132 and oxide film 232 interposed therebetween. Not only readout circuit substrate 200 may be placed on light-receiving element 100, but also a pressure may be applied to slightly deform oxide film 131 and oxide film 231 to temporarily compress light-receiving element 100 and readout circuit substrate 200. For example, a pressure of 0.0122 N is applied per pair of In bump 101 and In bump 201.

Next, heat treatment (reflowing) in a reducing atmosphere containing formic acid is performed. As a result, as shown in FIG. 22, oxide film 131 and oxide film 231 are reduced. In bump 101 and In bump 201 are bonded to form a conductive connection portion 81. In bump 102 and In bump 202 are bonded together to form a conductive connection portion 82. At the heat treatment, In bump 101, In bump 102, In bump 201, and In bump 202 are melted, and self-alignment is performed. The heat treatment in the reducing atmosphere containing formic acid is also performed by reflowing of solder or the like, and the atmosphere is easily controlled.

Next, as shown in FIG. 23, a sealing resin 83 is filled between first main surface 100*a* and second main surface 200*a*.

Thus, a photodetection device 1 is manufactured. In photodetection device 1, infrared light incident from main surface 10*b* side of substrate 10 through antireflection film 31 is detected.

In this embodiment, oxide film 131 is formed on the surface of In bump 101. Oxide film 132 is formed on the surface of In bump 102. Oxide film 231 is formed on the surface of In bump 201. Oxide film 232 is formed on the surface of In bump 202. In (indium) has a Mohs hardness of 1.2, whereas In$_2$O$_3$ has a Mohs hardness of about 5. Therefore, it is possible to suppress deformation of In bumps 101, 102, 201, and 202. Therefore, according to the present embodiment, a short circuit between pixels can be suppressed.

Thicknesses of oxide films 131, 132, 231, and 232 may be 1 nm or more, 10 nm or more, 20 nm or more, or 50 nm or more. As oxide film 131, oxide film 132, oxide film 231, and oxide film 232 are thicker, it is easier to suppress deformation of In bump 101, In bump 102, In bump 201, and In bump 202. On the other hand, when oxide film 131, oxide film 132, oxide film 231, and oxide film 232 are excessively thick, it may take a long time to form oxide film 131, oxide film 132, oxide film 231, and oxide film 232, or it may take a long time to remove oxide film 131, oxide film 132, oxide film 231, and oxide film 232 during reflowing. In terms of productivity, thicknesses of oxide film 131, oxide film 132, oxide film 231, and oxide film 232 may be 120 nm or less, 100 nm or less, or 80 nm or less.

Second Embodiment

Figure 24:
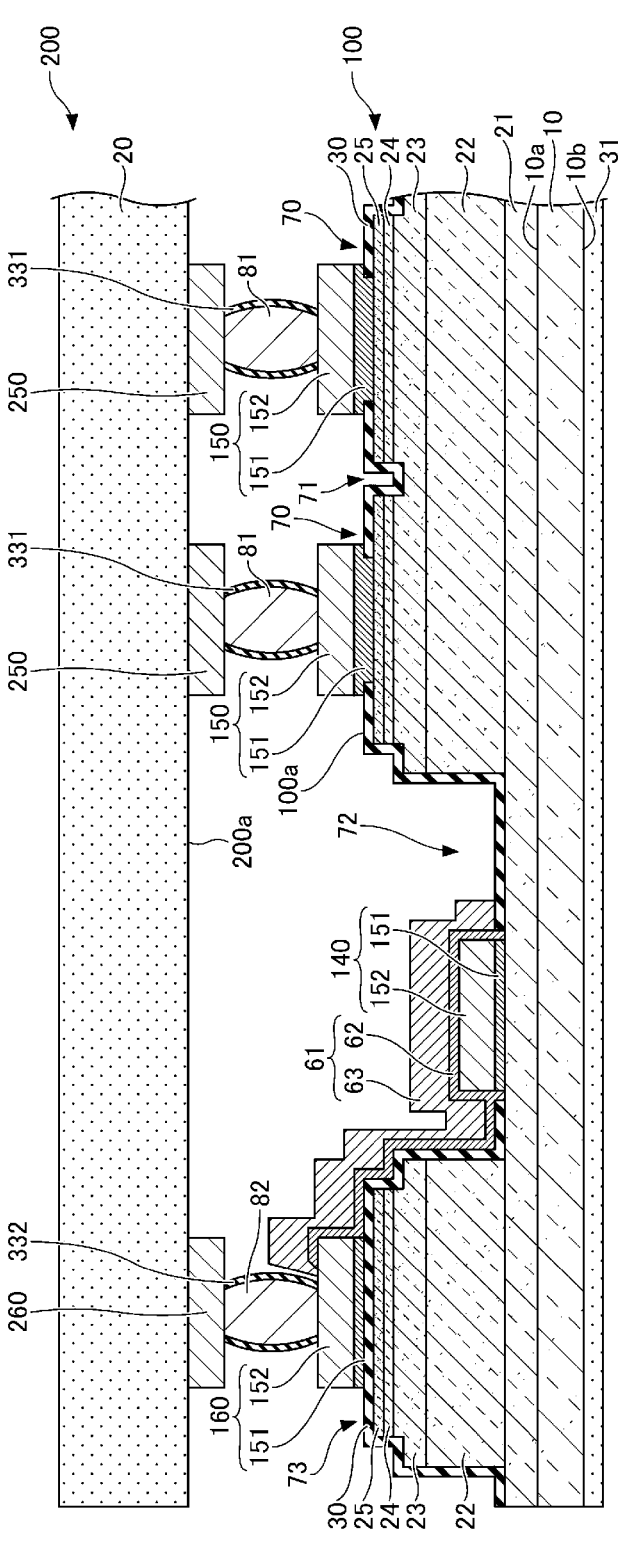
FIG. 24 is a cross-sectional view (Part 1) illustrating a method of bonding a light-receiving element and a readout circuit substrate in a second embodiment.
Figure 25:
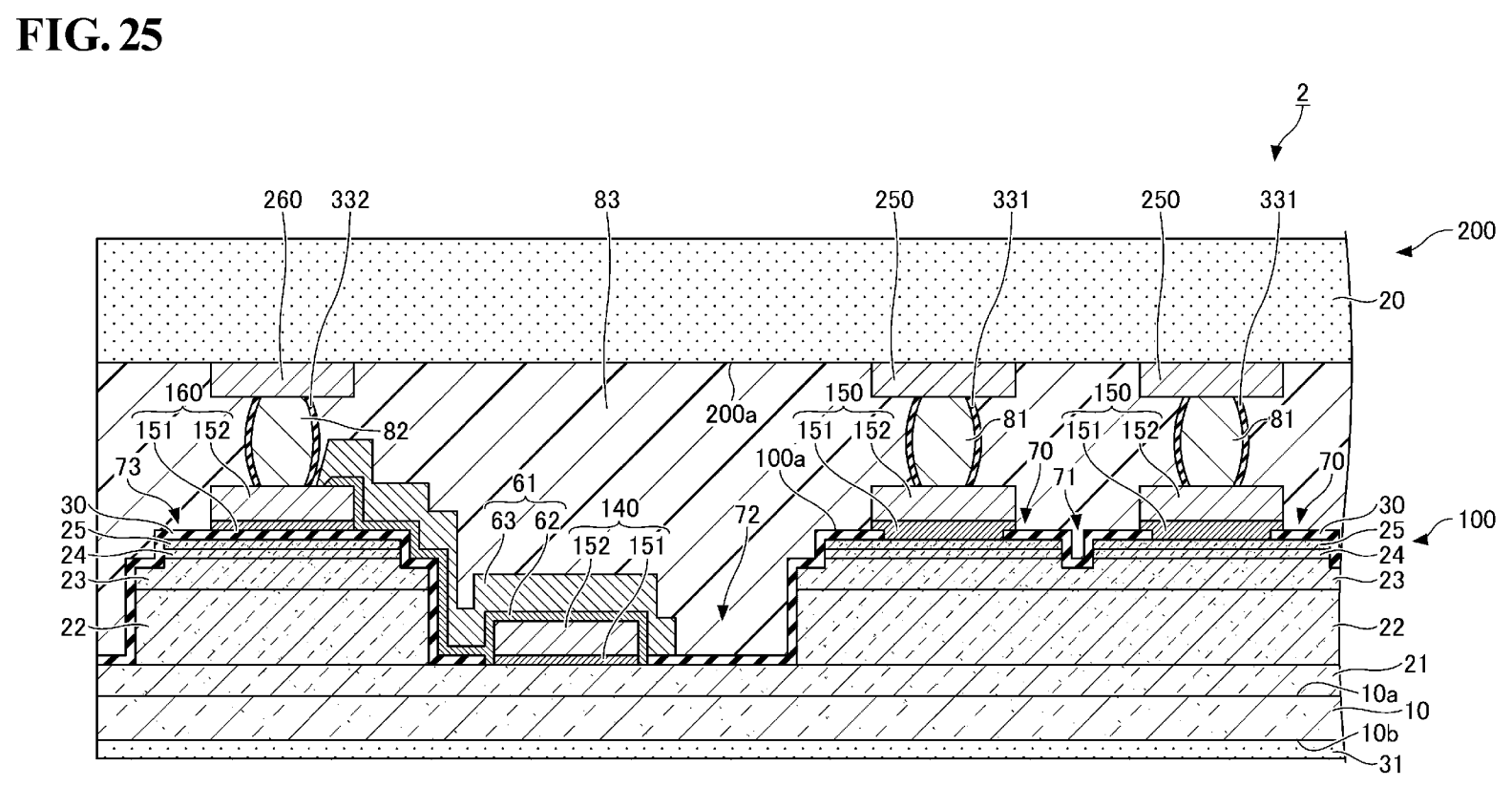

Next, a second embodiment will be described. The second embodiment differs from the first embodiment mainly in the method of joining light-receiving element 100 and readout circuit substrate 200. FIGS. 24 to 25 are cross-sectional views illustrating a method of bonding a light-receiving element and the readout circuit substrate according to a second embodiment.

In the second embodiment, conductive connection portion 81 and conductive connection portion 82 are formed by performing heat treatment in a reducing atmosphere containing formic acid in the same manner as in the first embodiment (see FIG. 22). Next, as shown in FIG. 24, an oxide film 331 is formed on the surface of conductive connection portion 81. An oxide film 332 is formed on a surface of conductive connection portion 82.

Oxide films 331 and oxide film 332 are formed by, for example, thermal oxidation. Specifically, oxide film 331 and oxide film 332 are formed by exposing conductive connection portion 81 and conductive connection portion 82 to an oxygen atmosphere at 500° C. or more and 900° C. or less for one hour or more. Oxide film 331 and oxide film 332 may be formed by natural oxidation. Specifically, oxide film 331 and oxide film 332 are formed by exposing conductive connection portion 81 and conductive connection portion 82 to the atmosphere at about room temperature, 10° C. or more and 30° C. or less, for two hours or more.

Next, as shown in FIG. 25, sealing resin 83 is filled between first main surface 100*a* and second main surface 200*a*.

Thus, a photodetection device 2 is manufactured. In photodetection device 2, similarly to photodetection device 1, infrared light incident from main surface 10*b* side of substrate 10 through antireflection film 31 is detected.

According to the second embodiment, the same effect as that of the first embodiment can be obtained. Oxide film 331 is formed on the surface of conductive connection portion 81, and oxide film 332 is formed on the surface of conductive connection portion 82. Therefore, deformation of conductive connection portion 81 and conductive connection portion 82 can be suppressed. For example, the deformation of conductive connection portion 81 and conductive connection portion 82 can be suppressed not only when an external force in a compression direction acts on conductive connection portion 81 and conductive connection portion 82 but also when an external force in a shear direction acts thereon.

The thicknesses of oxide films 331 and 332 may be 1 nm or more, 10 nm or more, 20 nm or more, 50 nm or more. As oxide film 331 and oxide film 332 are thicker, it is easier to suppress deformation of conductive connection portion 81 and conductive connection portion 82. On the other hand, when oxide film 331 and oxide film 332 are excessively thick, it takes a long time to form oxide film 331 and oxide film 332. In terms of productivity, thicknesses of oxide film 331 and oxide film 332 may be 120 nm or less, 100 nm or less, or 80 nm or less.

Figure 26:
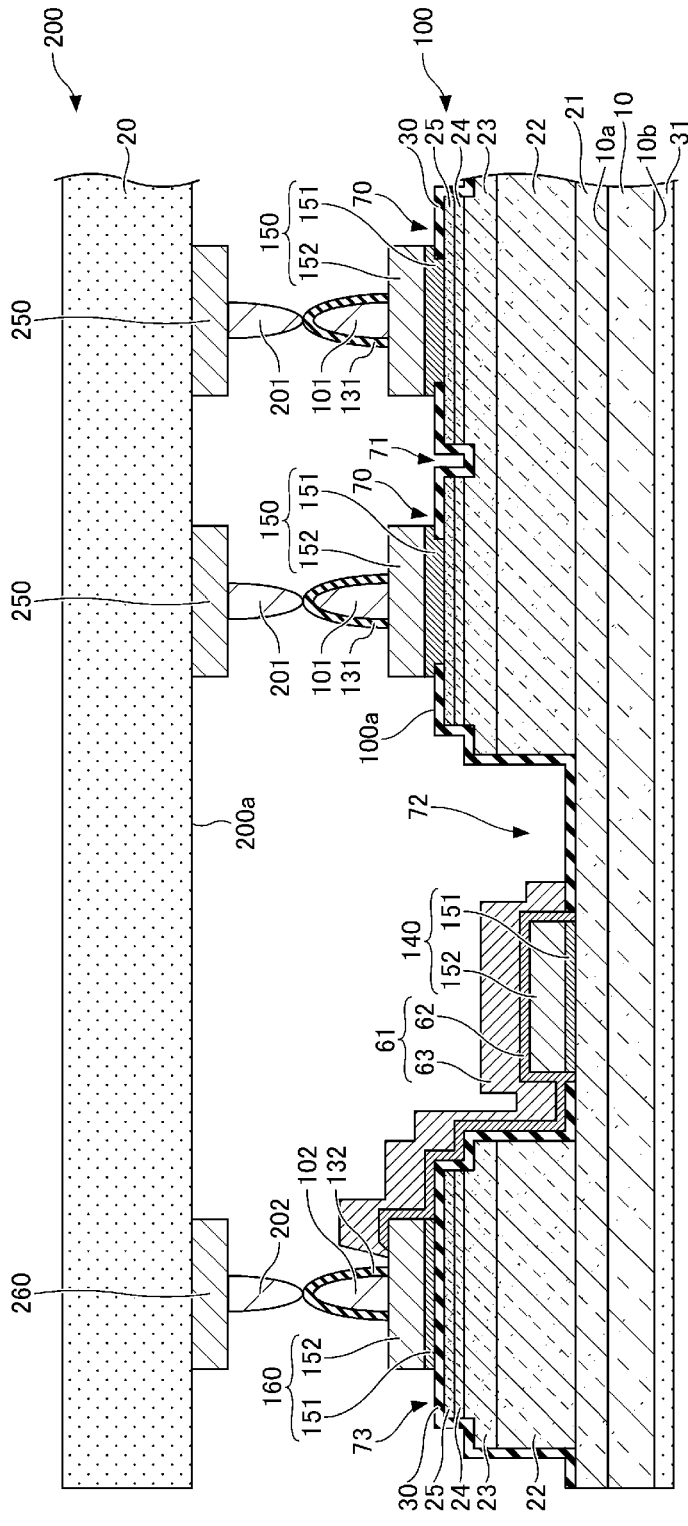
FIG. 26 is a cross-sectional view illustrating a method of bonding a light-receiving element and a readout circuit substrate in a variation of the first embodiment.

In the first embodiment, if oxide film 131 and oxide film 132 are formed, the formation of oxide film 231 and oxide film 232 may be omitted. That is, as shown in FIG. 26, first main surface 100*a* of light-receiving element 100 and second main surface 200*a* of readout circuit substrate 200 may face each other, In bump 101 and In bump 201 may be aligned with oxide film 131 interposed therebetween, and In bump 102 and In bump 202 may be aligned with oxide film 132 interposed therebetween. Even in this case, the deformation of In bump 101 and In bump 102 can be suppressed.

Similarly, in the first embodiment, if oxide film 231 and oxide film 232 are formed, the formation of oxide film 131 and oxide film 132 may be omitted. Even in this case, the deformation of In bump 201 and In bump 202 can be suppressed.

Also in the second embodiment, the formation of oxide film 131 and oxide film 132 may be omitted. Alternatively, formation of oxide film 231 and oxide film 232 may be omitted.

Although the embodiments have been described in detail above, the present invention is not limited to the specific embodiments, and various modifications and changes can be made within the scope described in the claims.

What is claimed is:

1. A method of manufacturing a photodetection device, the method comprising:

preparing a light-receiving element including a first main surface including an arrangement of a plurality of first electrodes;

forming a first bump containing indium on each of the plurality of first electrodes;

preparing a circuit substrate including a second main surface including an arrangement of a plurality of second electrodes;

forming a second bump containing indium on each of the plurality of second electrodes;

sputtering a first oxide containing indium to form a first deformation suppressing oxide film on at least one of a surface of the first bump or a surface of the second bump;

aligning, to suppress short circuits, the first bump and the second bump on top of each other with the first deformation suppressing oxide film therebetween by placing the first main surface and the second main surface so as to face each other; and bonding together the first bump and the second bump to form a conductive connection portion under reduction of the first deformation suppressing oxide film by heat treating in a reducing atmosphere.

2. The method according to claim 1, wherein the first deformation suppressing oxide film is formed at least on the surface of the first bump.

3. The method according to claim 1, wherein the first deformation suppressing oxide film is formed on both of the surface of the first bump and the surface of the second bump.

4. The method according to claim 1, wherein the first deformation suppressing oxide film has a thickness of 1 nm or more.

5. The method according to claim 1, wherein the reducing atmosphere includes formic acid.

6. The method according to claim 1, the method further comprising forming, at a surface of the conductive connection portion, a second oxide film containing indium.

7. The method according to claim 6, wherein the second oxide film has a thickness of 1 nm or more.

8. A photodetection device comprising:

a light-receiving element including a first main surface including an arrangement of a plurality of first electrodes, wherein each of the plurality of the first electrodes includes a first bump containing indium;

a circuit substrate including a second main surface facing the first main surface and including an arrangement of a plurality of second electrodes, wherein each of the plurality of the second electrodes includes a second bump containing indium;

a first deformation suppressing oxide film containing indium on at least one of a surface of the first bump or a surface of the second bump, wherein the first deformation suppressing oxide film is formed by sputtering a first oxide containing indium; and a conductive connection portion formed by bonding together the first bump and the second bump under reduction of the first deformation suppressing oxide film by heat treating in a reducing atmosphere, where the first bump and the second bump are aligned to suppress short circuits on top of each other with the first deformation suppressing oxide film therebetween.

9. The method according to claim 1, wherein the first deformation suppressing oxide film is formed at a rate of 0.13 nm/sec to 0.23 nm/sec.

10. The method according to claim 1, wherein the first oxide containing indium comprises indium oxide ($In_2O_3$).

11. The method according to claim 10, wherein the first deformation suppressing oxide film comprises indium oxide ($In_2O_3$).

12. The method according to claim 1, wherein the first bump comprises a Mohs hardness of approximately 1.2.

13. The method according to claim 12, wherein the first deformation suppressing film comprises a Mohs hardness of approximately 5.

* * * * *